(12) United States Patent
Cook et al.

(10) Patent No.: US 7,316,006 B2
(45) Date of Patent: Jan. 1, 2008

(54) EMBEDDING KEYS INTO TEST DATA

(75) Inventors: Kevin Robert Cook, Apple Valley, MN (US); Corey Virgil Swenson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 706 days.

(21) Appl. No.: 10/740,326

(22) Filed: Dec. 18, 2003

(65) Prior Publication Data

US 2005/0137841 A1   Jun. 23, 2005

(51) Int. Cl.
*G06F 9/45* (2006.01)
(52) U.S. Cl. ......................................... 717/135; 714/33
(58) Field of Classification Search ................ 717/135; 703/13; 714/33
See application file for complete search history.

(56) References Cited

U.S. PATENT DOCUMENTS

| | | | | |
|---|---|---|---|---|
| 5,684,946 A | * | 11/1997 | Ellis et al. ..................... | 714/33 |
| 5,864,658 A | * | 1/1999 | Theobald ..................... | 714/25 |
| 6,332,211 B1 | | 12/2001 | Pavela | |
| 6,571,204 B1 | * | 5/2003 | Meyer .......................... | 703/22 |
| 6,990,610 B2 | * | 1/2006 | Kootstra ..................... | 714/32 |
| 2002/0029377 A1 | | 3/2002 | Pavela | |
| 2004/0044508 A1 | * | 3/2004 | Hoffman, Jr. ................ | 703/13 |

\* cited by examiner

*Primary Examiner*—John Chavis
(74) *Attorney, Agent, or Firm*—Owen J. Gamon

(57) ABSTRACT

A method, apparatus, system, and signal-bearing medium that in an embodiment generate keys based on a number of commands that can be outstanding at a device under test at any one time, embed the keys into respective data associated with respective commands, and send the commands to a device under test. When output is received from the device under test, the key embedded in the output may be used to determine the command associated with the output. In this way, the data may remain random while the test case command associated with the output may be determined based on the data.

16 Claims, 5 Drawing Sheets

| TESTCASE COMMAND IDENTIFIER (205) | KEY IN FIRST TESTCASE RUN (210) | KEY IN SECOND TESTCASE RUN (215) |
|---|---|---|
| 0 | 3 | 0 |
| 1 | 4 | 2 |
| 2 | 7 | 6 |
| 3 | 0 | 3 |
| 4 | 2 | 1 |
| 5 | 6 | 7 |
| 6 | 1 | 5 |
| 7 | 5 | 4 |

FIG. 2

| TESTCASE COMMAND IDENTIFIER | RANDOM DATA | KEY CALCULATION | DATA WITH KEY |
|---|---|---|---|
| 0 | 0XF0 | 0 MOD 8 =0 ARRAY[0] = 3 | 0XF3 |
| 1 | 0X30 | 1 MOD 8 =1 ARRAY[1] = 4 | 0X34 |
| 2 | 0X70 | 2 MOD 8 = 2 ARRAY [2] =7 | 0X77 |
| 3 | 0XA0 | 3 MOD 8 = 3 ARRAY[3] = 0 | 0XA0 |
| 4 | 0X10 | 4 MOD 8 = 4 ARRAY[4] = 2 | 0X12 |
| 5 | 0X90 | 5 MOD 8 = 5 ARRAY[5] = 6 | 0X96 |
| 6 | 0X40 | 6 MOD 8 = 6 ARRAY[6] = 1 | 0X41 |
| 7 | 0XC0 | 7 MOD 8 = 7 ARRAY [7] = 5 | 0XC5 |
| 8 | 0XE0 | 8 MOD 8 = 0 ARRAY[0] = 3 | 0XE3 |

FIG. 3

EMBEDDING KEYS INTO TEST DATA

FIELD

An embodiment of the invention generally relates to integrated circuits. In particular, an embodiment of the invention generally relates to design verification of circuits via embedded keys in test data.

BACKGROUND

The development of the EDVAC computer system of 1948 is often cited as the beginning of the computer era. Since that time, computer systems have evolved into extremely sophisticated devices, and computer systems may be found in many different settings. Computer systems typically include a combination of hardware (such as semiconductors, integrated circuits, programmable logic devices, programmable gate arrays, and circuit boards) and software, also known as computer programs.

The typical design methodology for integrated circuit designs—such as very large scale integrated (VLSI) circuits and application specific integrated circuits (ASICs)—is conventionally divided into the following three stages. First, a design capture step is performed using, for example, a high-level language synthesis package. Next, design verification is made on the resulting design. This includes simulations, timing analysis, and automatic test pattern generation (ATPG) tools. Finally, there is layout and eventual tape out of the device. The device is then tested, and the process may need to be reiterated one or more times until the desired design criteria are satisfied.

The design capture step is typically involves the specification of a logic circuit by a designer. A hardware description language ("HDL") provides the designer with a mechanism for describing the operation of the desired logic circuit in a technology-independent manner using standard cells, which are physical layouts and timing behavior models for simple logic functions such as AND, OR, NOT, or FlipFlop. A large group of pre-designed standard cells is typically available as a standard cell library, which is typically provided at a nominal cost by the fabrication vendor who will eventually produce the actual chip. Examples of these standard cell libraries are available from fabrication vendors such as TSMC (Taiwan Semiconductor Manufacturing Company) or UMC (United Microelectronics Corporation).

Automated software tools available from companies such as Cadence Design Systems and Synopsys can take a netlist description of the integrated circuit, or netlist representing the desired logical functionality for a chip (sometimes referred to as a behavioral or register-transfer-level description), and map it into an equivalent netlist composed of the standard cells from a selected standard cell library. This process is commonly known as "synthesis."

A netlist is a data structure representation of the electronic logic system that comprises a set of modules, each of which comprises a data structure that specifies sub-components and their interconnection. The netlist describes the way standard cells and blocks are interconnected. Netlists are typically available in Verilog, EDIF (Electronic Design Interchange Format), or VHDL (Very High Speed Integrated Circuit Hardware Design Language) formats. Other software tools available from companies such as Cadence or Avant! can take a netlist comprised of standard cells and create a physical layout of the chip by placing the cells relative to each other to minimize timing delays or wire lengths, then creating electrical connections (or routing) between the cells to physically complete the desired circuit. Once a netlist has been generated from the logic design, there are a number of commercially available silicon compilers, also called place and route tools, which are used to convert the netlist into a semiconductor circuit layout. The semiconductor circuit layout specifies the physical implementation of the circuit in silicon or other semiconductor materials.

Design verification involves verifying that the logic definition is correct and that the circuit implements the function expected by the designers. Typically, this involves timing analysis and simulation tools. The data representation in the logic design database may be reformatted as needed prior to use by the timing analysis and simulation tools. The design undergoes design verification analysis in order to detect flaws in the design. The design is also analyzed by simulating the device resulting from the design to assess the functionality of the design. If errors are found or the resulting functionality is unacceptable, the designer modifies the design as needed. These design iterations help to ensure that the design satisfies its requirements.

Other verification methods include generating software models of the logic circuit design and testing the software model of the design with designer-specified testcases. Because it is not possible to check every possible condition that may be generated in the actual logic design, faulty logic may remain because it would not have been exercised by any of the testcases. Errors in the logic design may remain undetected until the release of a product on the marketplace, where it may cause costly redesigns.

Formal verification is another way to check logic design prior to the fabrication of a device. Formal verification is a technique wherein a logic circuit is modeled as a state transition system, and specifications are provided for components in the system. One way in which specifications may be made is through the use of logic formulas. Each of the components in the logic design is specified, and all possible behaviors of the design may be exercised by a tool which confirms that these specifications are met.

The design verification phase typically involves sending commands as input to the simulated circuit and verifying that the output of the simulated circuit in response to the commands is correct and is in the correct order. Unfortunately, commands with identical data can be sent to the simulated circuit with no way to determine if responses to the commands occur in the correct order. Thus, test environments are currently unable to verify that circuits are processing all commands in the correct order during simulation, which delays the detection and correction of errors, lengthens the product development cycle, and increases the cost of the product.

SUMMARY

A method, apparatus, system, and signal-bearing medium are provided that in an embodiment generate keys based on a number of commands that can be outstanding at a device under test at any one time, embed the keys into respective data associated with respective commands, and send the commands to a device under test. When output is received from the device under test, the key embedded in the output may be used to determine the command associated with the output. In this way, the data may remain random while the test case command associated with the output may be determined based on the data.

BRIEF DESCRIPTION OF THE DRAWINGS

FIG. 2 depicts a block diagram of an example array of testcase command identifiers and keys, according to an embodiment of the invention.

FIG. 3 depicts a block diagram of an example table of testcase command identifiers and data, both before and after a calculated key is added to the data, according to an embodiment of the invention.

DETAILED DESCRIPTION

Figure 1:
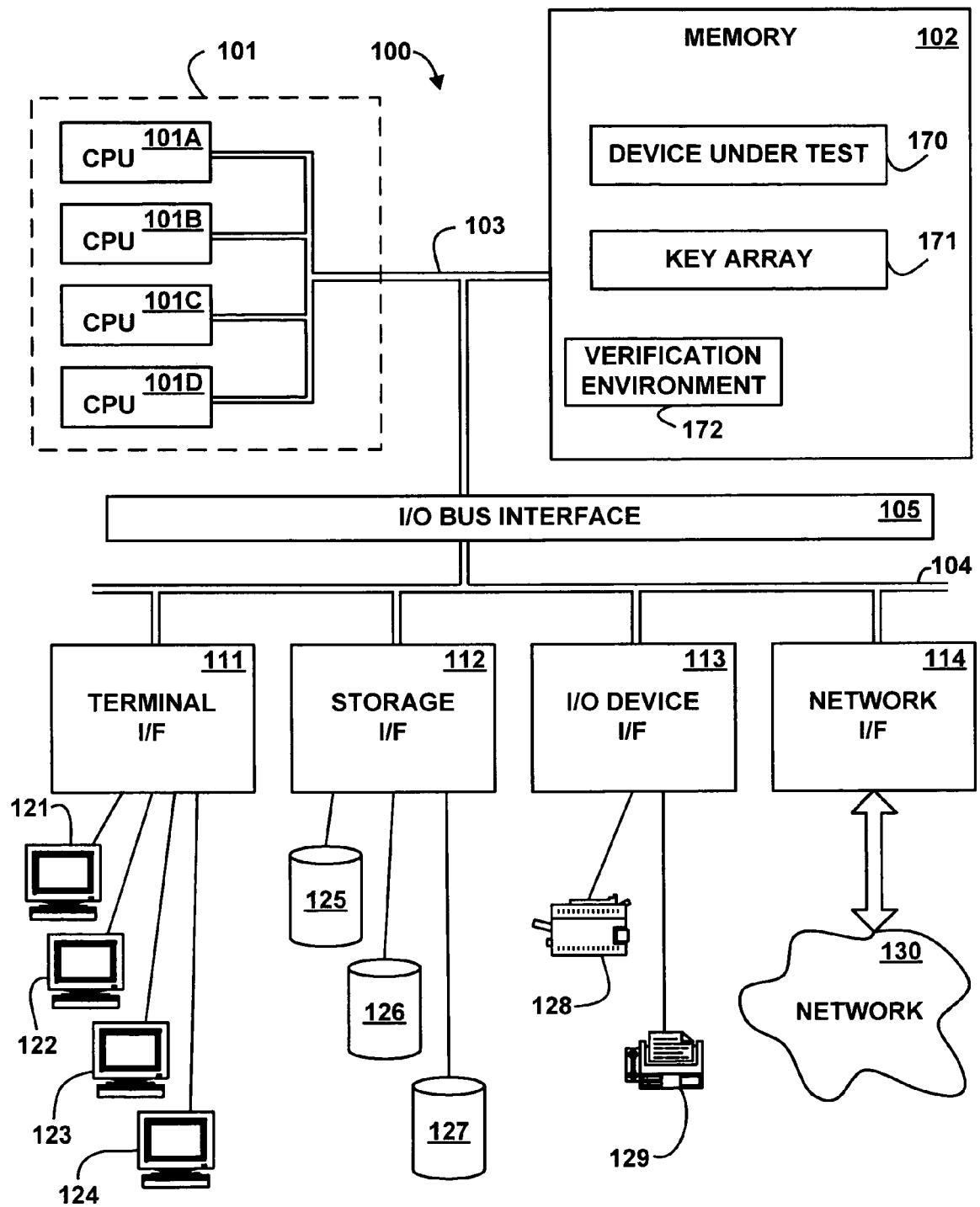
FIG. 1 depicts a block diagram of an example system for implementing an embodiment of the invention.

Referring to the Drawing, wherein like numbers denote like parts throughout the several views, FIG. 1 depicts a high-level block diagram representation of a computer system 100, according to an embodiment of the present invention. The major components of the computer system 100 include one or more processors 101, a main memory 102, a terminal interface 111, a storage interface 112, an I/O (Input/Output) device interface 113, and communications/network interfaces 114, all of which are coupled for inter-component communication via a memory bus 103, an I/O bus 104, and an I/O bus interface unit 105.

The computer system 100 contains one or more general-purpose programmable central processing units (CPUs) 101A, 101B, 101C, and 101D, herein generically referred to as the processor 101. In an embodiment, the computer system 100 contains multiple processors typical of a relatively large system; however, in another embodiment the computer system 100 may alternatively be a single CPU system. Each processor 101 executes instructions stored in the main memory 102 and may include one or more levels of on-board cache.

The main memory 102 is a random-access semiconductor memory for storing data and programs. The main memory 102 is conceptually a single monolithic entity, but in other embodiments the main memory 102 is a more complex arrangement, such as a hierarchy of caches and other memory devices. E.g., memory may exist in multiple levels of caches, and these caches may be further divided by function, so that one cache holds instructions while another holds non-instruction data, which is used by the processor or processors. Memory may further be distributed and associated with different CPUs or sets of CPUs, as is known in any of various so-called non-uniform memory access (NUMA) computer architectures.

The memory 102 includes a device under test 170, a key array 171, and a verification environment 172. Although the device under test 170, the key array 171, and the verification environment 172 are illustrated as being contained within the memory 102 in the computer system 100, in other embodiments some or all of them may be on different computer systems and may be accessed remotely, e.g., via the network 130. The computer system 100 may use virtual addressing mechanisms that allow the programs of the computer system 100 to behave as if they only have access to a large, single storage entity instead of access to multiple, smaller storage entities. Thus, while the device under test 170, the key array 171, and the verification environment 172 are illustrated as residing in the memory 102, these elements are not necessarily all completely contained in the same storage device at the same time.

The device under test 170 may be represented as a netlist or any other appropriate format or data simulation of a circuit, chip, card, or other hardware device. Although the device under test 170 is illustrated as being contained in the memory 102, in another embodiment, the device under test 170 may be a physical hardware device that is connected to the verification environment 172 via a bus, cable, or other hardware mechanism.

The key array 171 is a data structure used by the verification environment 172 to send commands to the device under test 170 and interpret responses or other output from the device under test 170. The key array 171 may include keys indexed by testcase command identifiers and is further described below with reference to FIG. 2.

In an embodiment, the verification environment 172 includes instructions capable of executing on the processor 101 or statements capable of being interpreted by instructions executing on the processor 101 to perform the functions as further described below with reference to FIGS. 2, 3, 4, and 5. In another embodiment, the notification environment 172 may be implemented in microcode. In yet another embodiment, the notification environment 172 may be implemented in hardware via logic gates and/or other appropriate hardware techniques, in lieu of or in addition to a processor-based system.

The memory bus 103 provides a data communication path for transferring data among the processors 101, the main memory 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The system I/O bus 104 may be, e.g., an industry standard PCI (Peripheral Component Interconnect) bus, or any other appropriate bus technology. The I/O interface units support communication with a variety of storage and I/O devices. For example, the terminal interface unit 111 supports the attachment of one or more user terminals 121, 122, 123, and 124. The storage interface unit 112 supports the attachment of one or more direct access storage devices (DASD) 125, 126, and 127 (which are typically rotating magnetic disk drive storage devices, although they could alternatively be other devices, including arrays of disk drives configured to appear as a single large storage device to a host). The I/O and other device interface 113 provides an interface to any of various other input/output devices or devices of other types. Two such devices, the printer 128 and the fax machine 129, are shown in the exemplary embodiment of FIG. 1, but in other embodiment many other such devices may exist, which may be of differing types. The network interface 114 provides one or more communications paths from the computer system 100 to other digital devices and computer systems; such paths may include, e.g., one or more networks 130.

The network 130 may be any suitable network or combination of networks and may support any appropriate protocol suitable for communication of data and/or code to/from the computer system 100. In various embodiments, the network 130 may represent a storage device or a combination of storage devices, either connected directly or indirectly to the computer system 100. In an embodiment, the network 130 may support Infiniband. In another embodiment, the network 130 may support wireless communications. In another embodiment, the network 130 may support hard-wired communications, such as a telephone line or cable. In another embodiment, the network 130 may support the Ethernet IEEE (Institute of Electrical and Electronics Engineers) 802.3x specification. In another embodiment, the network 130 may be the Internet and may support IP (Internet Protocol). In another embodiment, the network 130 may be a local area network (LAN) or a wide area network (WAN). In another embodiment, the network 130 may be a hotspot service provider network. In another embodiment, the network 130 may be an intranet. In another embodiment, the network 130 may be a GPRS (General Packet Radio Service) network. In another embodiment, the network 130 may be a FRS (Family Radio Service) network. In another embodiment, the network 130 may be any appropriate cellular data network or cell-based radio network technology. In another embodiment, the network 130 may be an IEEE 802.11B wireless network. In still another embodiment, the network 130 may be any suitable network or combination of networks. Although one network 130 is shown, in other embodiments any number of networks (of the same or different types) may be present.

Although the memory bus 103 is shown in FIG. 1 as a relatively simple, single bus structure providing a direct communication path among the processors 101, the main memory 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, etc. Furthermore, while the I/O bus interface 105 and the I/O bus 104 are shown as single respective units, the computer system 100 may in fact contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

The computer system 100 depicted in FIG. 1 has multiple attached terminals 121, 122, 123, and 124, such as might be typical of a multi-user "mainframe" computer system. Typically, in such a case the actual number of attached devices is greater than those shown in FIG. 1, although the present invention is not limited to systems of any particular size. The computer system 100 may alternatively be a single-user system, typically containing only a single user display and keyboard input, or might be a server or similar device which has little or no direct user interface, but receives requests from other computer systems (clients). In other embodiments, the computer system 100 may be implemented as a personal computer, portable computer, laptop or notebook computer, PDA (Personal Digital Assistant), tablet computer, pocket computer, telephone, pager, automobile, teleconferencing system, appliance, or any other appropriate type of electronic device.

It should be understood that FIG. 1 is intended to depict the representative major components of the computer system 100 at a high level, that individual components may have greater complexity that represented in FIG. 1, that components other than or in addition to those shown in FIG. 1 may be present, and that the number, type, and configuration of such components may vary. Several particular examples of such additional complexity or additional variations are disclosed herein; it being understood that these are by way of example only and are not necessarily the only such variations.

The various software components illustrated in FIG. 1 and implementing various embodiments of the invention may be implemented in a number of manners, including using various computer software applications, routines, components, programs, objects, modules, data structures, etc., referred to hereinafter as "computer programs," or simply "programs." The computer programs typically comprise one or more instructions that are resident at various times in various memory and storage devices in the computer system 100, and that, when read and executed by one or more processors 101 in the computer system 100, cause the computer system 100 to perform the steps necessary to execute steps or elements embodying the various aspects of an embodiment of the invention.

Moreover, while embodiments of the invention have and hereinafter will be described in the context of fully functioning computer systems, the various embodiments of the invention are capable of being distributed as a program product in a variety of forms, and the invention applies equally regardless of the particular type of signal-bearing medium used to actually carry out the distribution. The programs defining the functions of this embodiment may be delivered to the computer system 100 via a variety of signal-bearing media, which include, but are not limited to:

(1) information permanently stored on a non-rewriteable storage medium, e.g., a read-only memory device attached to or within a computer system, such as a CD-ROM readable by a CD-ROM drive;

(2) alterable information stored on a rewriteable storage medium, e.g., a hard disk drive (e.g., DASD 125, 126, or 127) or diskette; or (3) information conveyed to the computer system 100 by a communications medium, such as through a computer or a telephone network, e.g., the network 130, including wireless communications.

Such signal-bearing media, when carrying machine-readable instructions that direct the functions of the present invention, represent embodiments of the present invention.

In addition, various programs described hereinafter may be identified based upon the application for which they are implemented in a specific embodiment of the invention. But, any particular program nomenclature that follows is used merely for convenience, and thus embodiments of the invention should not be limited to use solely in any specific application identified and/or implied by such nomenclature.

The exemplary environments illustrated in FIG. 1 are not intended to limit the present invention. Indeed, other alternative hardware and/or software environments may be used without departing from the scope of the invention.

FIG. 2 depicts a block diagram of an example key array 171 of testcase command identifiers 205 and corresponding keys 210 for a first testcase run and keys 215 for a second testcase run, according to an embodiment of the invention. The testcase command identifiers 205 identify the commands that the verification environment 172 sends to the device under test 170. The keys 210 and 215 are random keys generated by the verification environment 172.

The verification environment 172 uses the keys 210 and 215 to imbed into data in the commands associated with the corresponding testcases command identifiers 205, as further described below with reference to FIGS. 3, 4, and 5. The keys 210 and 215 contain different data for the different testcase runs (e.g., the first and second runs of the testcase) in order to ensure that the testcase command data is random while allowing the verification environment 172 to identify the testcase command solely based on the data. In an embodiment, the number of bits used for the keys 210 and the keys 215 is based on the total number of commands that can be in process at any one time. For example, if a maximum of 128 commands may be in process at any one them, then 7 bits are needed to represent each of the keys 210 and 215. But, in other embodiments, the keys 210 and 215 may be represented by any number of appropriate bits.

The data illustrated in the key array 171 is for example purposes only, and any appropriate data may be used. Further, any appropriate number of rows and columns in the key array 171 may be present. Also, in other embodiments, the key array 171 may have a different data structure format from rows and columns.

FIG. 3 depicts a block diagram of an example table 300 of testcase command identifiers 205, random data 310, a key calculation 315, and random data after the calculated key is added 320, according to an embodiment of the invention. The verification environment 172 generates the random data 310, performs the key calculation 315 using the key array 171, and embeds the result of the key calculation 315 into the random data 310 to yield the data with the key 320. The verification environment 172 then sends the data with the embedded key 320 to the device under test 170 along with the associated testcase command identifier 205.

In an embodiment, the verification environment 172 performs the key calculation 315 by calculating the value of the testcase command identifier 205 mod the number of testcase commands that may be outstanding at any one time and uses the result as an index into the key array 171 to determine the key to insert into the random data 310. In the example of FIG. 3, the number of testcase commands that may be outstanding at any one time is 8, but in other embodiments any appropriate number of testcase commands may be outstanding at any one time.

Thus, in the example row 325, the verification environment 172 calculates the testcase command identifier (0) mod the number of possible outstanding commands (8) to yield a result (0). The verification environment 172 uses the result (0) as an index into the key array 171 (FIG. 2) to yield the key (3), which is the key in the first testcase run 210 associated with the testcase command identifier (0). The verification environment 172 then embeds the key (3) into the random data 310 (0xF0 in row 325), to yield the data with key 320 (0xF3 in the example row 325).

In the example data of FIG. 3, only one byte of random data is used, and the three key bits are placed in the least significant bits of the random data 310. The least significant bits of the random data 310 are shown as 0 for illustration purposes only. In other embodiments, all of the random data may be randomized, and the random data and key may be of any size. The example rows 325 and 330 are illustrated with the same key (0) because the testcase command associated with the identifier (0) in the example row 325 will complete before the testcase command associated with the identifier (8) in the example row 330 is sent to the device under test 170 since in this example only eight commands may be outstanding at any one time. Thus, the number of keys is large enough so that there is no duplication of outstanding keys. In another embodiment, the commands need not finish in order, in which case the number of keys is equal to the number of commands that can be issued before the first command completes.

Figure 4:
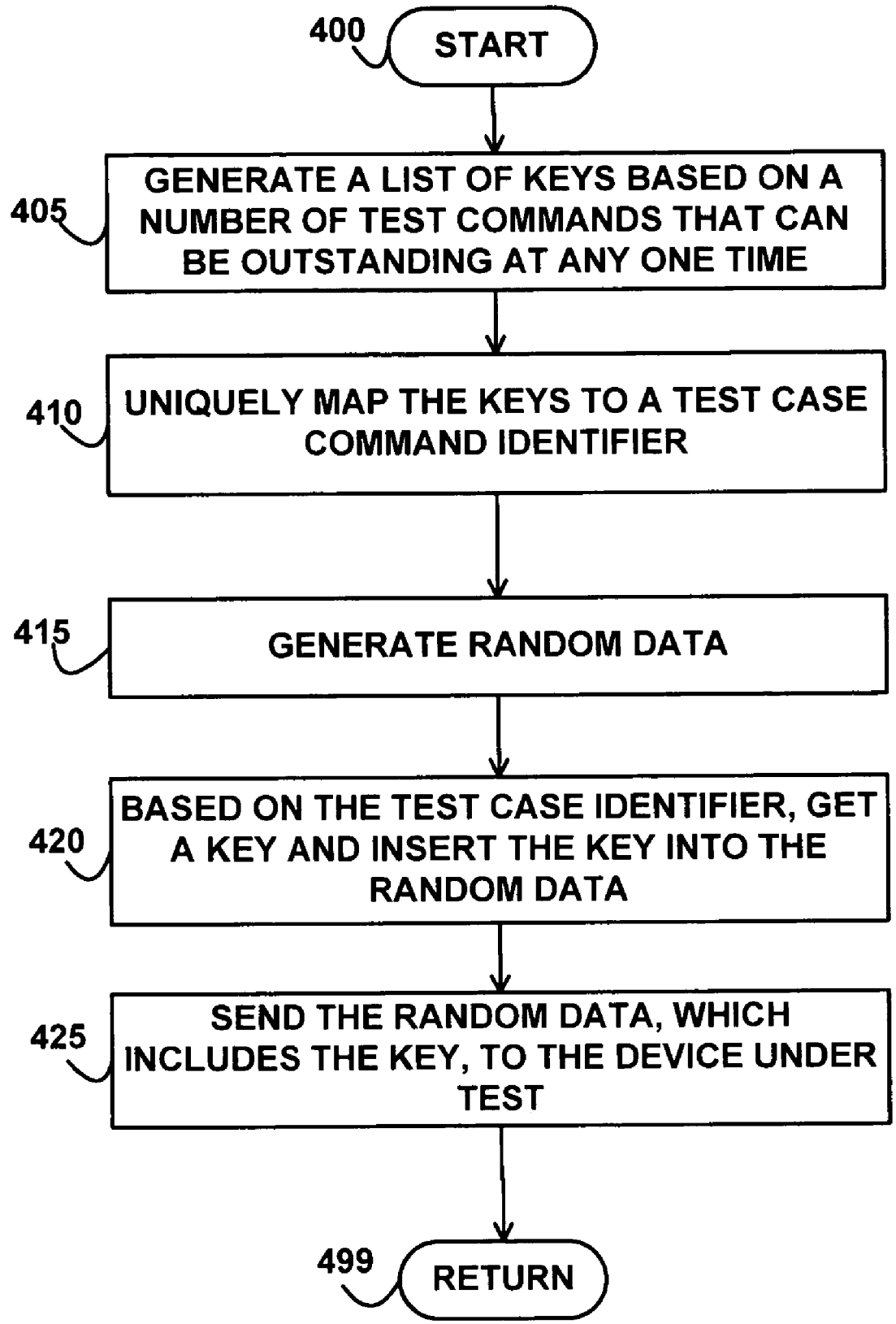
FIG. 4 depicts a flowchart of example processing for processing a testcase command in a verification environment, according to an embodiment of the invention.

FIG. 4 depicts a flowchart of example processing for processing testcase commands by the verification environment 172, according to an embodiment of the invention. Control begins at block 400. Control then continues to block 405 where the verification environment 172 generates a list of keys based on the number of testcase commands that can be outstanding at any one time. Two examples of the list of keys are illustrated in FIG. 2 as the keys in the first testcase run 210 and the keys in the second testcase run 215.

Control then continues to block 410 where the verification environment 172 uniquely maps each of the keys in the list to respective testcase command identifiers. An example of the mapping is illustrated in FIG. 2 where each of the keys 210 and 215 are associated with a corresponding testcase command identifier 205.

Control then continues to block 415 where the verification environment 172 generates random data associated with each testcase command identifier. An example of the generated random data is illustrated in FIG. 3 as the random data 310, each of which is associated with a respective testcase command identifier 205.

Control then continues to block 420 where the verification environment 172, based on the testcase identifier and the number of possible outstanding testcase commands at one time, calculates a key and inserts the key into the random data. In an embodiment, the verification environment 172 performs the calculation by calculating the testcase command identifier mod the number of possible outstanding commands and uses the result to index into the key array 171, as previously described above with reference to FIG. 3. In other embodiments, any appropriate calculation may be used.

Control then continues to block 425 where the verification environment 172 sends the random data, which includes the key, to the device under test 170.

Control then continues to block 499 where the logic of FIG. 4 returns.

Figure 5:
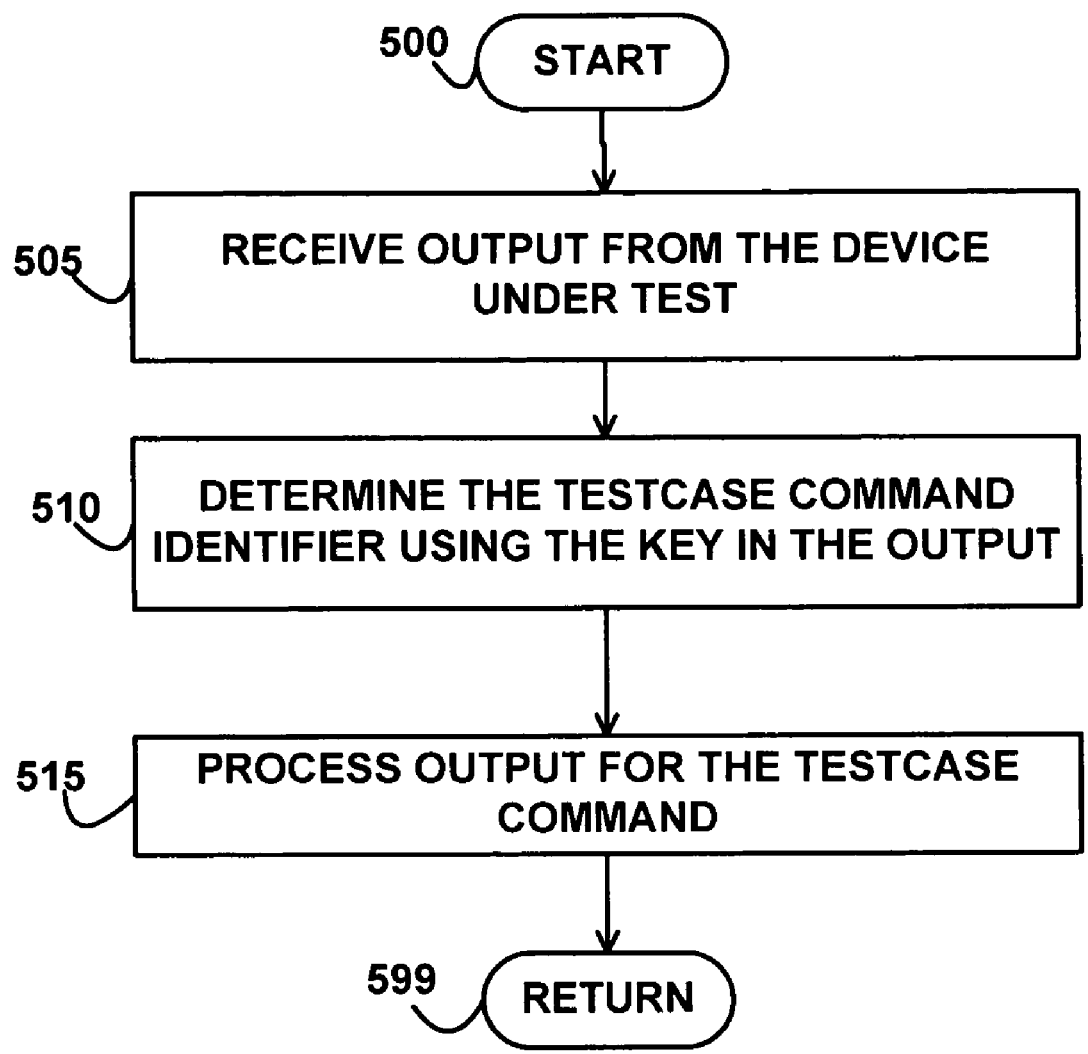
FIG. 5 depicts a flowchart of example processing for processing output from a device under test in a verification environment, according to an embodiment of the invention.

FIG. 5 depicts a flowchart of example processing for processing output from the device under test 170 in a verification environment, according to an embodiment of the invention. Control begins at block 500. Control then continues to block 505 where the verification environment 172 receives output from the device under test 170. Control then continues to block 510 where the verification environment 172 determines the testcase command identifier 205 associated with the output using the key in the data in the response and the key array 171. Although the same key can map to multiple testcase command identifiers 205, the keys are unique within the testcase commands that can be outstanding at any one time, so the testcase command can be absolutely determined.

Control then continues to block 515 where the verification environment 172 processes output for the testcase command associated with the determined testcase command identifier 205. In an embodiment, the verification environment 172 verifies the order of the output using the key in the response data. In another embodiment, the commands need not finish in order, in which case the number of keys is equal to the number of commands that can be issued before the first command completes. Control then continues to block 599 where the logic of FIG. 5 returns.

In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. Different instances of the word "embodiment" as used within this specification do not necessarily refer to the same embodiment, but they may. The previous detailed description is, therefore, not to be taken in a limiting sense, and the scope of the present invention is defined only by the appended claims.

In the previous description, numerous specific details were set forth to provide a thorough understanding of the invention. But, the invention may be practiced without these specific details. In other instances, well-known circuits, structures, and techniques have not been shown in detail in order not to obscure the invention.

What is claimed is:

1. A method comprising:
generating a plurality of keys based on a number of commands that can be outstanding at a time at a device under test;
calculating each of a plurality of command identifiers mod the number of commands that can be outstanding at a time at the device under test;
embedding each of the plurality of keys into each of a respective plurality of pieces of data associated with a respective plurality of commands, wherein the embedding uses a result of the calculating to determine which of the plurality of keys to embed in each of the plurality of pieces of data; and
sending the plurality of commands and the plurality of pieces of data to the device under test.

2. The method of claim 1, further comprising:
mapping each of the plurality of keys to a respective plurality of command identifiers for each of the plurality of commands.

3. The method of claim 1, further comprising:
generating the plurality of pieces of data, wherein the data is random.

4. The method of claim 1, further comprising:
generating a different plurality of keys for a different testcase run.

5. An apparatus comprising:
means for generating a plurality of keys based on a number of commands that can be outstanding at a time at a device under test;
means for mapping each of the plurality of keys to a respective plurality of command identifiers for each a the plurality of commands;
means for calculating each of the plurality of command identifiers mod the number of commands that can be outstanding at a time at the device under test;
means for embedding each of the plurality of keys into each of a respective plurality of pieces of data associated with the respective plurality of commands, wherein the means for embedding uses a result of the means for calculating to determine which of the plurality of keys to embed in each of the plurality of pieces of data; and
means for sending the plurality of commands and the plurality of pieces of data to the device under test.

6. The apparatus of claim 5, further comprising:
means for generating the plurality of pieces of data, wherein the data is random.

7. The apparatus of claim 5, further comprising:
means for generating a different plurality of keys for a different testcase run.

8. The apparatus of claim 5, further comprising:
means for receiving output from the device under test, wherein the output contains one of the plurality of keys.

9. A storage medium encoded with instructions, wherein the instructions when executed comprise:
generating a plurality of keys based on a number of commands that can be outstanding at a time at a device under test;
mapping each of the plurality of keys to a respective plurality of command identifiers for each of a plurality of commands;
generating a plurality of pieces of random data associated with the respective plurality of commands;
calculating each of the plurality of command identifiers mod the number of commands that can be outstanding at a time at the device under test;
embedding each of the plurality of keys into each of the respective plurality of pieces of random data, wherein the embedding uses a result of the calculating to determine which of the plurality of keys to embed in each of the plurality of pieces of random data; and
sending the plurality of commands and the plurality of pieces of random data to the device under test.

10. The storage medium of claim 9, further comprising:
generating a different plurality of keys for a different testcase run.

11. The storage medium of claim 9, further comprising:
receiving output from the device under test, wherein the output contains one of the plurality of keys.

12. The storage medium of claim 11, further comprising:
determining one of the plurality of command identifiers associated with the output based on the one of the plurality of keys in the output.

13. A computer system comprising:
a processor; and
memory encoded with instructions, wherein the instructions when executed on the processor comprise:
generating a plurality of keys based on a number of commands that can be outstanding at a time at a device under test,
mapping each of the plurality of keys to a respective plurality of command identifiers for each of a plurality of commands,
generating a plurality of pieces of random data associated with the respective plurality of commands,
calculating each of the plurality of command identifiers mod the number of commands that can be outstanding at a time at the device under test,
embedding each of the plurality of keys into each of the respective plurality of pieces of random data, wherein the embedding uses a result of the calculating to determine which of the plurality of keys to embed in each of the plurality of pieces of random data, and
sending the plurality of commands and the plurality of pieces of random data to the device under test.

14. The computer system of claim 13, wherein the instructions further comprise:
generating a different plurality of keys for a different testcase run.

15. The computer system of claim 13, wherein the instructions further comprise:
receiving output from the device under test, wherein the output contains one of the plurality of keys.

16. The computer system of claim 15, wherein the instructions further comprise:
determining one of the plurality of command identifiers associated with the output based on the one of the plurality of keys in the output.

* * * * *